United States Patent [19]
Dolan et al.

[11] Patent Number: 5,682,080
[45] Date of Patent: Oct. 28, 1997

[54] METHOD AND APPARATUS FOR IGNITING ELECTRODELESS LAMP DISCHARGE

[75] Inventors: James T. Dolan, Frederick; Brian P. Turner, Damascus; Michael G. Ury, Bethesda; Charles H. Wood, Rockville, all of Md.

[73] Assignee: Fusion Lighting, Inc., Rockville, Md.

[21] Appl. No.: 740,558

[22] Filed: Oct. 30, 1996

Related U.S. Application Data

[60] Division of Ser. No. 438,600, May 10, 1995, which is a continuation-in-part of Ser. No. 149,818, Nov. 10, 1993, which is a continuation of Ser. No. 60,553, May 13, 1993, abandoned, which is a continuation-in-part of Ser. No. 867,551, Apr. 13, 1992, abandoned, Ser. No. 875,769, Apr. 29, 1992, abandoned, and Ser. No. 882,409, May 13, 1992, abandoned, each is a continuation-in-part of Ser. No.779, 718, Oct. 23, 1991, abandoned, which is a continuation-in-part of Ser. No. 604,487, Oct. 25, 1990, abandoned.

[51] Int. Cl.$^6$ .................. H01J 17/20; H01J 61/12; H01J 61/18
[52] U.S. Cl. .................. 313/570; 313/571; 313/572; 313/607; 313/234; 315/248
[58] Field of Search .................. 313/570, 571, 313/572, 601, 607, 234; 315/248, 39

[56] References Cited

U.S. PATENT DOCUMENTS

| | | | |
|---|---|---|---|
| 4,247,800 | 1/1981 | Proud et al. | 315/248 |
| 4,359,668 | 11/1982 | Ury | 315/39 |
| 5,140,227 | 8/1992 | Dakin et al. | 313/234 |
| 5,334,913 | 8/1994 | Ury et al. | 313/234 |
| 5,404,076 | 4/1995 | Dolan et al. | 313/572 |

*Primary Examiner*—Nimeshkumar Patel

[57] ABSTRACT

Ignition of an electrodeless lamp, energized by microwave or radio frequency energy, is achieved by disposing an additive material in the lamp envelope along with the primary fill material. In a first embodiment, the additive is at least partially electrically conductive at room temperatures but non-conductive or a vapor at lamp operating temperatures. The preferred additives for this embodiment are mercury sulfide and mercury selenide. In a second embodiment, the additive is a material, such as piezoelectric crystals, that produces sparks in the envelope when the crystals collide with each other, or with other materials, in response to agitation of the envelope. The additive may alternatively build up electrostatic charge by rubbing along the interior surface of the lamp envelope when the envelope is agitated, the charge build up being sufficient to ignite the primary fill material.

12 Claims, 1 Drawing Sheet

METHOD AND APPARATUS FOR IGNITING ELECTRODELESS LAMP DISCHARGE

CROSS REFERENCE TO RELATED APPLICATIONS

This application is a division of patent application Ser. No. 08/438,600, filed May 10, 1995 which is a continuation-in-part of U.S. application Ser. No. 08/149,818 filed Nov. 10, 1993 which is a continuation of U.S. application Ser. No. 08/060,553, now abandoned filed May 13, 1993 which is a continuation-in-part of U.S. application Ser. No. 07/867,551, now abandoned, filed Apr. 13, 1992, U.S. application Ser. No. 07/875,769, now abandoned, filed Apr. 29, 1992 and U.S. application Ser. No. 07/882,409, now abandoned, filed May 13, 1992, each of which application is a continuation-in-part of U.S. application Ser. No. 07/779,718, now abandoned, filed Oct. 23, 1991 which is a continuation-in-part of U.S. application Ser. No. 07/604,487, now abandoned filed Oct. 25, 1990, now abandoned.

BACKGROUND OF THE INVENTION

1. Technical Field

The present invention pertains to improvements in methods and apparatus for igniting fill within bulbs of electrodeless lamps, and has particular, although not limited, utility in lamps of the type disclosed in U.S. Pat. No. 5,404,076, the disclosure of which is expressly incorporated herein in its entirety.

2. Discussion of the Prior Art

Electrodeless lamps of the type with which the present invention is concerned are comprised of a light transmissive envelope containing a plasma-forming medium. A microwave or radio frequency (r.f.) energy source has its output energy coupled to the envelope via a coupling arrangement to excite a plasma, resulting in a light discharge.

In order to initiate breakdown (i.e., ignite the discharge) various techniques have been suggested. For example, in U.S. Pat. No. 4,359,668 (Ury), a supplemental ultraviolet igniter bulb, energized by extracting a portion of the primary microwave energy, emits energetic photons incident on the electrodeless lamp envelope. These photons ionize the fill within the envelope to effect the desired discharge therein.

Although ignition devices disposed outside the envelope can be effective, they consume space and add to the cost of the overall lamp. Even if an external or supplemental light source is used for starting, starting is not always reliable. It is desirable, therefore, to incorporate an additive in the fill material that has a low ionization potential and, therefore, facilitates initial breakdown so that the primary fill can be ignited. One category of low ionization potential material suitable for this purpose is the group of alkalai metals in either elemental or compound form. These metals, including sodium, lithium, potassium, rubidium and cesium, are suggested as additives in the above-referenced U.S. patent application Ser. No. 08/149,818 for bulbs having sulfur or selenium, in elemental or compound forms, as the primary fill material. Also suggested for the same purpose in that application are the IIIB metals (including indium, thallium, gallium and aluminum) and the alkaline or rare earth elements (including barium, beryllium, magnesium, calcium, strontium and radium) in elemental or compound form. Also mentioned in that patent application is that the addition of mercury to the bulb improves starting reliability.

Some prior art systems assist startup by generating an arc discharge to free electrons through use of a conductive component to either concentrate an electric field or introduce a concentrated field from an external power source. Other systems employ radioactive material to supply free electrons. These approaches suffer from major disadvantages. Specifically, a concentration or introduction of fields requires additional circuitry components to implement the system, thereby increasing labor time and cost. Further, the use of radioactive materials requires special attention and extra care in handling such materials.

FIG. 1 illustrates a typical configuration of an electrodeless lamp of the type with which the present invention is concerned. Specifically, a generator 16 generates microwave or r.f. energy and delivers the energy into waveguide 18. Waveguide 18 directs the generated energy waves into cavity 6, typically provided with a mesh grid 8 for retaining the generated waves within cavity 6 while allowing light waves to exit. A bulb 10 in cavity 6 is spherical or otherwise suitably configured and contains a fill which provides light (i.e., visible, ultra-violet, etc., depending upon the particular fill material) when excited by the generated energy waves. Specifically, the radiation of the energy waves excites the fill atoms in bulb 10 to effect discharge of electrons. The discharged electrons collide with other fill atoms causing a further discharge of electrons, thereby increasing the total population of free electrons. The increased population of free electrons results in increased collisions and the process avalanches into radiation of light. Bulb 10 is connected by its elongate stem 12 to motor 14 which rotates bulb 10 and stem 12 about the longitudinal axis of the stem. A cooling gas stream is typically directed at bulb 10, and the rotation of the bulb results in uniform cooling.

As noted above, copending patent application Ser. No. 08/149,818 discloses the advantages of having the fill material of the bulbs comprise elemental sulfur or selenium or their respective compounds. These elements provide light in known visible spectra at high efficiency and demonstrate longevity and stable color over time. As also noted above, occasionally, the fill material in the bulb does not immediately ignite in response to the applied energy waves and it becomes desirable to assist the initial ignition by including in the bulb additives having low ionization potentials. These additives contain loose electrons capable of being easily dislodged so that they can collide with atoms of the primary fill to discharge electrons from those atoms. The collisions increase and avalanche into ignition of the fill, resulting in the emission of light.

OBJECTS AND SUMMARY OF THE INVENTION

We have now discovered that an improved starting capability can be obtained in electrodeless lamps, particularly but not necessarily lamps having sulfur or selenium fill, by adding small amounts of mercury sulfide (HgS) or mercury selenide (HgSe). The addition of mercury sulfide or mercury selenide causes an arc discharge (spark) in response to radiation by microwave or r.f. energy to generate free electrons from the fill and thereby accelerate ignition.

Accordingly, it is an object of the present invention to provide an inexpensive, reliable, and nonintrusive method and arrangement for enhancing ignition in electrodeless lamps without the use of additional circuitry or radioactive materials.

It is another object of the invention to provide an additive to the primary fill in electrodeless lamps that will greatly enhance the starting or ignition capability of the lamp.

According to the present invention, initial ignition of the fill in electrodeless lamps is accomplished by generation of an arc discharge to produce free electrons from the fill during radiation by generated waves. In a first embodiment, an additive material, preferably HgS or HgSe, is solid and partially conductive (e.g., a semiconductor) at room temperature while becoming a vapor or nonconductive at the operating temperature of the lamp, and is disposed in the bulb along with the primary fill. Some of the r.f. or microwave energy applied to the bulb couples to the solid additive material and it is believed that this increases the field intensity around the additive to initiate an arc discharge. It is to be noted that a liquid conductor such as mercury will not function as the additive material for this purpose because the field concentration requires relatively sharp edges. Alternatively, the electrical energy may rapidly heat the solid additive material to vaporization (i.e., explosion) creating a small region of low density gas wherein an electrical breakdown from the field surrounding the small region is likely. The additive material must either become electrically non-conductive or a vapor when the lamp reaches operating temperature since the required energy concentrating effects would create a hot spot on the envelope, possibly leading to lamp failure.

A second embodiment of the invention involves generation of sparks by mechanical abrasion within the envelope. Specifically, a solid additive material is included in the bulb along with the fill, and is of the type that produces sparks when mechanically abraded. For example, piezoelectric crystals are suitable for this purpose. A motor rotates or shakes the bulb to agitate and create collisions between the solid additive material crystals in order to produce the sparks and a resultant arc discharge. Alternatively, solid additive material may be attached to the bulb wall, and when the bulb is rotated or shaken, collisions between the attached and loose material produce the arc discharge.

The above and still further objects, features and advantages of the present invention will become apparent upon consideration of the following detailed description of a specific embodiment thereof, particularly when taken in conjunction with the accompanying drawings wherein like reference numerals in the various figures are utilized to designate like components.

DESCRIPTION OF THE PREFERRED EMBODIMENT

Figure 1:
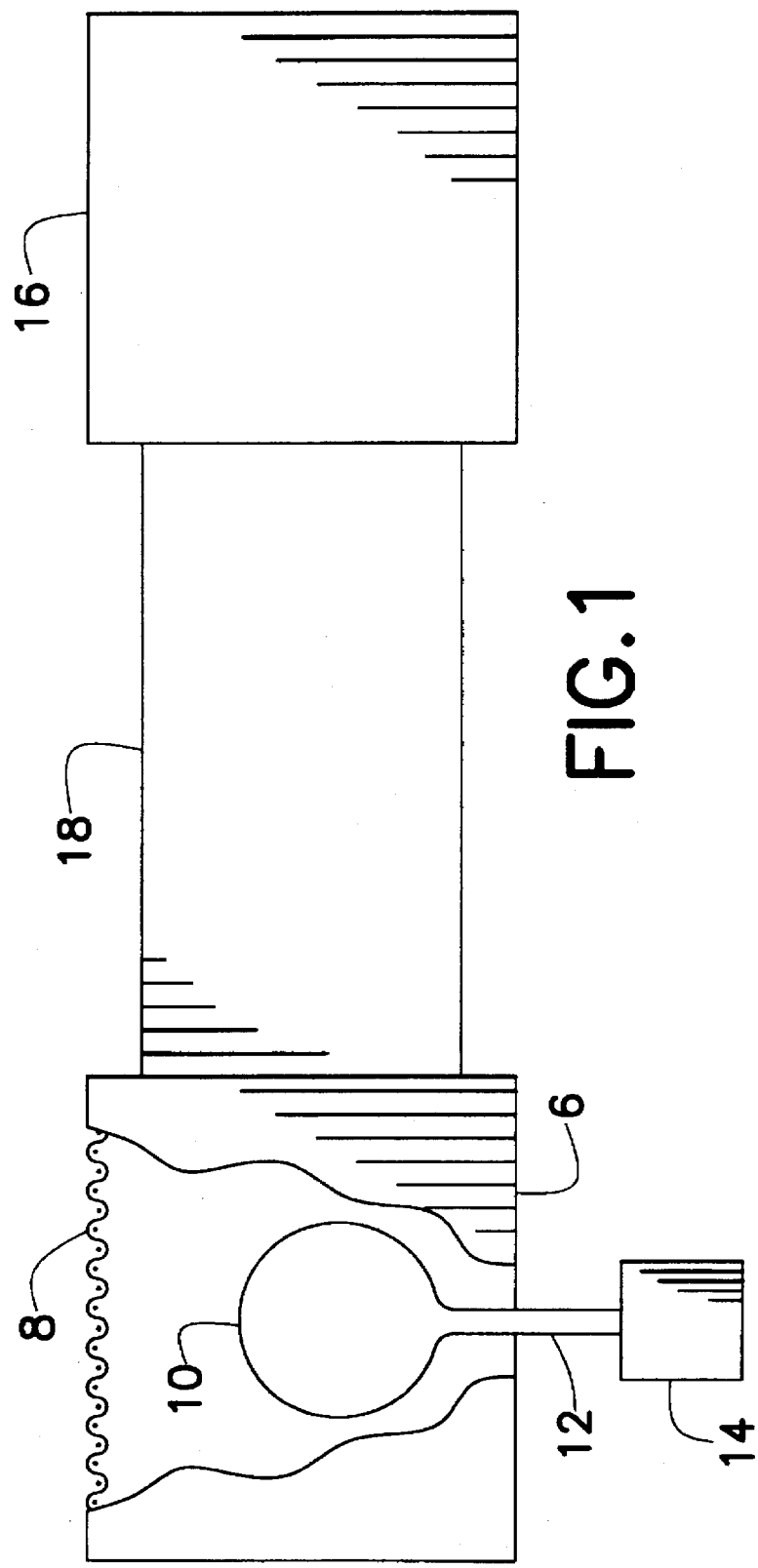
FIG. 1 is a block diagram of a typical electrodeless lamp of the type with which the present invention may be utilized.

According to a first embodiment of the present invention, acceleration of ignition in bulb 10 of FIG. 1 is accomplished by the generation of an arc discharge to produce free electrons from the fill in the bulb. Specifically, an additive material, having the properties of being a solid and partially conductive at room temperature while becoming a vapor or nonconductive at operating temperatures of electrodeless lamp 1, is added to the fill. Electrical energy from applied microwave or r.f. radiation couples to the additive material and is believed to increase the field intensity around that material to initiate an arc discharge. In any case, we have observed, upon initial application of microwave energy that small sparks are present within the bulb at locations corresponding to the locations of the mercury sulfide. The presence of these sparks creates enough free electrons to initiate the discharge. As the lamp heats up the additive compound (e.g., the mercury sulfide) dissociates, removing the possibility of local overheating. Alternatively, the applied electrical energy field from the radiation may rapidly heat the additive material to vaporization and thereby create a region of low density gas wherein the likelihood of an electrical breakdown from the applied field is increased. The breakdown in the low density gas region results in an arc discharge which generates free electrons to collide with atoms of the fill. The collisions discharge electrons of the fill atoms, thereby increasing the population of free electrons. The increased population of free electrons increases collisions and the process eventually avalanches into ignition of the fill and radiation of light. The preferred embodiment typically, although not necessarily, utilizes mercury sulfide (HgS) or mercury selenide (HgSe) as the additive, and elemental sulfur or selenium as the fill, although sulfur or selenium compounds may be used as described above. This type of additive is also suitable for effecting enhanced starting with other fill materials, and we have observed improved starting in lamps with up to at least 300 Torr of xenon or krypton gas.

In a second embodiment of the present invention electrodeless lamp 1 is substantially similar to the electrodeless lamp described above. Piezoelectric crystals, or other material capable of producing an arc discharge, are added to the fill in bulb 10. Motor 14 is may be capable of either rotating or axially shaking bulb 10, or both. During application of microwave or r.f. energy to the bulb, motor 14 either shakes or rotates bulb 10 such that the piezoelectric crystals collide with and abrade one another. The collisions and abrasions create sparks and an arc discharge to generate free electrons for excitation of the fill as described above. Alternatively, piezoelectric material may be secured or attached to the interior surface of the envelope or wall of bulb 10. As motor 14 rotates or shakes bulb 10, the piezoelectric material on the envelope wall is struck by other fill material or by piezoelectric crystals loose in the bulb. The collisions create an arc discharge to generate free electrons for excitation of the fill as described above. Alternatively, or in addition, electrostatic charge can be built up on the rotating dielectric particles as they rub against the quartz wall of the bulb. If sufficient potential (i.e., static charge) builds up, an arc occurs.

It will be appreciated that the embodiments described above and illustrated in the drawings represent only a few of the many ways of implementing electrodeless discharge in accordance with the principles of the present invention.

The primary fill in the bulb is preferably sulfur or selenium but may be any of the fills described herein or in the prior art as capable of producing visible or ultra-violet light in response to exposure to radiation.

The wave generator may be implemented by a magnetron or any other means capable of producing microwave energy, or by any suitable r.f. source.

The rotation motor may be implemented by any known means capable of rotating and/or shaking the stem and bulb.

Additives for the first described embodiment of the invention may be any compound capable of being partially conductive and solid at room temperature and nonconductive or a vapor at the operating temperature of the electrodeless lamp. Preferably, the additive in this embodiment is mercury sulfide or mercury selenide.

The piezoelectric crystal material preferred for the second embodiment may be any solid material capable of producing an arc discharge when abraded by another solid material. Further, the piezoelectric material may be attached to the bulb wall in any way that renders the material capable of producing collisions and subsequent arc discharges.

From the foregoing description it will be appreciated that the invention makes available a novel method and apparatus for electrodeless discharge wherein materials are added to the fill in a bulb to generate an arc discharge to stimulate the fill to accelerate ignition.

Having described preferred embodiments of a new and improved method and apparatus for electrodeless discharge, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. An electrodeless lamp comprising:

a light transmissive envelope;

a primary fill material disposed in said envelope, said primary fill material having the characteristic of emitting visible or ultraviolet light when ignited and excited by high frequency electrical energy;

means for selectively exciting said primary fill material with said high frequency electrical energy;

an additive material disposed in said envelope for facilitating ignition of said primary fill material, said additive material having the characteristic, when agitated sufficiently to collide with the same or other material, of producing sparks to ignite said primary fill material in said envelope; and means for repetitively moving said envelope to agitate said additive material.

2. The lamp of claim 1 wherein said additive material is piezoelectric crystals.

3. The lamp of claim 2 wherein said means for moving comprises a motor for rotating said envelope.

4. The lamp of claim 2 wherein said means for moving comprises a motor for shaking said envelope.

5. The lamp of claim 1 wherein at least some of said additive material is adhered to an inside surface of said envelope.

6. A method for facilitating ignition of a primary fill material in a light transmissive envelope of an electrodeless lamp, said method comprising the steps of:

(a) disposing in said envelope an additive material that, when agitated sufficiently to collide with the same or other material in the envelope, produces sparks to ignite said primary fill material; and (b) repetitively moving said envelope to agitate said additive material.

7. The method of claim 6 wherein step (a) comprises disposing piezoelectric crystals in said envelope as said additive material.

8. The method of claim 6 wherein step (a) includes adhering said additive material to an inside surface of said envelope.

9. An electrodeless lamp comprising:

a light transmissive envelope having an interior surface;

a primary fill material disposed in said envelope, said primary fill material having the characteristic of emitting light when ignited and excited by high frequency electrical energy;

means for selectively exciting said primary fill material with said high frequency electrical energy;

an additive dielectric material disposed in said envelope for facilitating ignition of said primary fill material, said additive material having the characteristic, when agitated sufficiently to rub along said interior surface of said envelope, of building up electrostatic charge to a level sufficient to ignite said primary fill material in said envelope; and means for repetitively moving said envelope to agitate said additive material.

10. The lamp of claim 9 wherein said means for moving comprises a motor for rotating said envelop.

11. The lamp of claim 9 wherein said means for moving comprises a motor for shaking said envelope.

12. A method for facilitating ignition of a primary fill material in a light transmissive envelope of an electrodeless lamp, said method comprising the steps of:

(a) disposing in said envelope a dielectric additive material that, when agitated sufficiently to rub along the inside surface of said envelope, builds up sufficient electrostatic charge to ignite said primary fill material; and (b) repetitively moving said envelope to agitate said additive material.

* * * * *